(12) United States Patent
Gilarranz et al.

(10) Patent No.: US 9,024,493 B2
(45) Date of Patent: *May 5, 2015

(54) METHOD FOR ON-LINE DETECTION OF RESISTANCE-TO-GROUND FAULTS IN ACTIVE MAGNETIC BEARING SYSTEMS

(75) Inventors: Jose L. Gilarranz, Katy, TX (US); Timothy R. Griffin, Allegany, NY (US)

(73) Assignee: Dresser-Rand Company, Olean, NY (US)

( * ) Notice: Subject to any disclaimer, the term of this patent is extended or adjusted under 35 U.S.C. 154(b) by 759 days.

This patent is subject to a terminal disclaimer.

(21) Appl. No.: 13/332,869

(22) Filed: Dec. 21, 2011

(65) Prior Publication Data

US 2012/0169168 A1 Jul. 5, 2012

Related U.S. Application Data

(60) Provisional application No. 61/428,429, filed on Dec. 30, 2010.

(51) Int. Cl.
| | | |
|---|---|---|
| *H02K 7/09* | (2006.01) | |
| *G01M 13/04* | (2006.01) | |
| *G01R 31/02* | (2006.01) | |
| *F16C 37/00* | (2006.01) | |
| *F16C 32/04* | (2006.01) | |
| *G01R 31/34* | (2006.01) | |

(52) U.S. Cl.
CPC ................. *H02K 7/09* (2013.01); *G01M 13/04* (2013.01); *G01R 31/025* (2013.01); *G01R 31/343* (2013.01); *F16C 37/005* (2013.01); *F16C 32/0442* (2013.01)

(58) Field of Classification Search
USPC ......................................................... 310/90.5
See application file for complete search history.

(56) References Cited

U.S. PATENT DOCUMENTS

| | | | |
|---|---|---|---|
| 5,191,811 A | 3/1993 | Kogure | |
| 5,201,587 A | 4/1993 | Springer | |
| 5,202,024 A | 4/1993 | Andersson et al. | |
| 5,202,026 A | 4/1993 | Lema | |
| 5,203,891 A | 4/1993 | Lema | |
| 5,207,810 A | 5/1993 | Sheth | |

(Continued)

FOREIGN PATENT DOCUMENTS

| | | |
|---|---|---|
| CA | 2 647 511 | 10/2007 |
| DE | 44 19 364 A1 | 12/1995 |

(Continued)

OTHER PUBLICATIONS

Atlas Bronze, "Copper Alloys, Iron Alloys," Brochure, 2 pages.

(Continued)

*Primary Examiner* — Dang Le
(74) *Attorney, Agent, or Firm* — Edmonds & Nolte, PC

(57) ABSTRACT

A magnetic bearing is disclosed that includes a sensing wire wrapped around one or more of the bearing coils and configured to measure the resistance to ground of each bearing coil. With the presence of contaminants such as liquids, a protective coating disposed about the bearing coils degrades over time, thereby reducing the resistance to ground of the bearing coils. The sensing wire transmits the detected resistance to ground of the bearing coils to an adjacent sensing device, which can provide an output that informs a user whether corrective action is required to prevent damage or failure of the magnetic bearing.

20 Claims, 4 Drawing Sheets

(56) References Cited

U.S. PATENT DOCUMENTS

| | | |
|---|---|---|
| 5,211,427 A | 5/1993 | Washizu et al. |
| 5,215,384 A | 6/1993 | Maier |
| 5,215,385 A | 6/1993 | Ide |
| 5,219,232 A | 6/1993 | Adams et al. |
| 5,231,323 A | 7/1993 | New |
| 5,246,346 A | 9/1993 | Schiesser |
| 5,251,985 A | 10/1993 | Monzel |
| 5,267,798 A | 12/1993 | Budris |
| 5,272,403 A | 12/1993 | New |
| 5,273,249 A | 12/1993 | Peterson et al. |
| 5,285,123 A | 2/1994 | Kataoka et al. |
| 5,302,091 A | 4/1994 | Horiuchi |
| 5,306,051 A | 4/1994 | Loker et al. |
| 5,310,311 A | 5/1994 | Andres et al. |
| 5,311,432 A | 5/1994 | Momose |
| 5,337,779 A | 8/1994 | Fukuhara |
| 5,340,272 A | 8/1994 | Fehlau |
| 5,341,527 A | 8/1994 | Schmidt et al. |
| 5,345,127 A | 9/1994 | New |
| 5,347,190 A | 9/1994 | Lewis et al. |
| 5,355,040 A | 10/1994 | New |
| 5,355,042 A | 10/1994 | Lewis et al. |
| 5,356,226 A | 10/1994 | Onishi et al. |
| 5,378,121 A | 1/1995 | Hackett |
| 5,385,446 A | 1/1995 | Hays |
| 5,403,019 A | 4/1995 | Marshall |
| 5,421,655 A | 6/1995 | Ide et al. |
| 5,421,708 A | 6/1995 | Utter |
| 5,425,345 A | 6/1995 | Lawrence et al. |
| 5,425,584 A | 6/1995 | Ide |
| 5,427,455 A | 6/1995 | Bosley |
| 5,443,581 A | 8/1995 | Malone |
| 5,445,013 A | 8/1995 | Clayton, Jr. et al. |
| 5,484,521 A | 1/1996 | Kramer |
| 5,494,448 A | 2/1996 | Johnson et al. |
| 5,495,221 A | 2/1996 | Post |
| 5,496,394 A | 3/1996 | Nied |
| 5,500,039 A | 3/1996 | Mori et al. |
| 5,509,782 A | 4/1996 | Streeter |
| 5,514,924 A | 5/1996 | McMullen et al. |
| 5,521,448 A | 5/1996 | Tecza et al. |
| 5,525,034 A | 6/1996 | Hays |
| 5,525,146 A | 6/1996 | Straub |
| 5,531,811 A | 7/1996 | Kloberdanz |
| 5,538,259 A | 7/1996 | Uhrner et al. |
| 5,542,831 A | 8/1996 | Scarfone |
| 5,547,287 A | 8/1996 | Zeidan |
| 5,575,309 A | 11/1996 | Connell |
| 5,585,000 A | 12/1996 | Sassi |
| 5,593,232 A | 1/1997 | Maier |
| 5,601,155 A | 2/1997 | Gardner |
| 5,605,172 A | 2/1997 | Schubert et al. |
| 5,616,976 A | 4/1997 | Fremerey et al. |
| 5,628,623 A | 5/1997 | Skaggs |
| 5,630,881 A | 5/1997 | Ogure et al. |
| 5,634,492 A | 6/1997 | Steinruck et al. |
| 5,640,472 A | 6/1997 | Meinzer et al. |
| 5,641,280 A | 6/1997 | Timuska |
| 5,642,944 A | 7/1997 | Dublin, Jr. et al. |
| 5,645,399 A | 7/1997 | Angus |
| 5,651,616 A | 7/1997 | Hustak et al. |
| 5,653,347 A | 8/1997 | Larsson |
| 5,664,420 A | 9/1997 | Hays |
| 5,669,717 A | 9/1997 | Kostrzewsky |
| 5,682,759 A | 11/1997 | Hays |
| 5,683,185 A | 11/1997 | Buse |
| 5,683,235 A | 11/1997 | Welch |
| 5,685,691 A | 11/1997 | Hays |
| 5,687,249 A | 11/1997 | Kato |
| 5,693,125 A | 12/1997 | Dean |
| 5,693,994 A | 12/1997 | New |
| 5,703,424 A | 12/1997 | Dorman |
| 5,709,528 A | 1/1998 | Hablanian |
| 5,713,720 A | 2/1998 | Barhoum |
| 5,714,818 A | 2/1998 | Eakman et al. |
| 5,720,799 A | 2/1998 | Hays |
| 5,738,356 A | 4/1998 | Marshall |
| 5,738,445 A | 4/1998 | Gardner |
| 5,743,654 A | 4/1998 | Ide et al. |
| 5,749,700 A | 5/1998 | Henry et al. |
| 5,750,040 A | 5/1998 | Hays |
| 5,752,774 A | 5/1998 | Heshmat et al. |
| 5,759,011 A | 6/1998 | Moll |
| 5,775,882 A | 7/1998 | Kiyokawa et al. |
| 5,779,619 A | 7/1998 | Borgstrom et al. |
| 5,791,868 A | 8/1998 | Bosley et al. |
| 5,795,135 A | 8/1998 | Nyilas et al. |
| 5,797,990 A | 8/1998 | Li |
| 5,800,092 A | 9/1998 | Nill et al. |
| 5,803,612 A | 9/1998 | Bättig |
| 5,810,485 A | 9/1998 | Dublin, Jr. |
| 5,810,558 A | 9/1998 | Streeter |
| 5,827,040 A | 10/1998 | Bosley et al. |
| 5,848,616 A | 12/1998 | Vogel et al. |
| 5,850,857 A | 12/1998 | Simpson |
| 5,853,585 A | 12/1998 | Nesseth |
| 5,863,023 A | 1/1999 | Evans et al. |
| 5,866,518 A | 2/1999 | Dellacorte et al. |
| 5,899,435 A | 5/1999 | Mitsch et al. |
| 5,927,720 A | 7/1999 | Zinsmeyer et al. |
| 5,935,053 A | 8/1999 | Strid |
| 5,938,803 A | 8/1999 | Dries |
| 5,938,819 A | 8/1999 | Seery |
| 5,946,915 A | 9/1999 | Hays |
| 5,948,030 A | 9/1999 | Miller et al. |
| 5,951,066 A | 9/1999 | Lane et al. |
| 5,957,656 A | 9/1999 | De Long |
| 5,965,022 A | 10/1999 | Gould |
| 5,967,746 A | 10/1999 | Hagi et al. |
| 5,971,702 A | 10/1999 | Afton et al. |
| 5,971,907 A | 10/1999 | Johannemann et al. |
| 5,977,677 A | 11/1999 | Henry et al. |
| 5,980,218 A | 11/1999 | Takahashi et al. |
| 5,988,524 A | 11/1999 | Odajima et al. |
| 6,011,829 A | 1/2000 | Panasik |
| 6,035,934 A | 3/2000 | Stevenson et al. |
| 6,036,435 A | 3/2000 | Oklejas |
| 6,059,539 A | 5/2000 | Nyilas et al. |
| 6,068,447 A | 5/2000 | Foege |
| 6,078,120 A | 6/2000 | Casaro et al. |
| 6,090,174 A | 7/2000 | Douma et al. |
| 6,090,299 A | 7/2000 | Hays et al. |
| 6,095,690 A | 8/2000 | Nielgel |
| 6,111,333 A | 8/2000 | Takahashi et al. |
| 6,113,675 A | 9/2000 | Branstetter |
| 6,122,915 A | 9/2000 | Hays |
| 6,123,363 A | 9/2000 | Burgard et al. |
| 6,135,639 A | 10/2000 | Dede |
| 6,145,844 A | 11/2000 | Waggott |
| 6,149,825 A | 11/2000 | Gargas |
| 6,151,881 A | 11/2000 | Ai et al. |
| 6,155,720 A | 12/2000 | Bättig |
| 6,191,513 B1 | 2/2001 | Chen et al. |
| 6,194,801 B1 | 2/2001 | Göransson |
| 6,196,809 B1 | 3/2001 | Takahashi et al. |
| 6,196,962 B1 | 3/2001 | Purvey et al. |
| 6,206,202 B1 | 3/2001 | Galk et al. |
| 6,214,075 B1 | 4/2001 | Filges et al. |
| 6,217,637 B1 | 4/2001 | Toney et al. |
| 6,227,379 B1 | 5/2001 | Nesseth |
| 6,232,688 B1 | 5/2001 | Ress, Jr. et al. |
| 6,244,749 B1 | 6/2001 | Nakagawa et al. |
| 6,255,752 B1 | 7/2001 | Werner |
| 6,277,278 B1 | 8/2001 | Conrad et al. |
| 6,309,174 B1 | 10/2001 | Oklejas, Jr. et al. |
| 6,310,414 B1 | 10/2001 | Agahi et al. |
| 6,312,021 B1 | 11/2001 | Thomas |
| 6,314,738 B1 | 11/2001 | Hays |
| 6,353,272 B1 | 3/2002 | van der Hoeven |
| 6,353,273 B1 | 3/2002 | Heshmat et al. |
| 6,367,241 B1 | 4/2002 | Ress, Jr. et al. |
| 6,372,006 B1 | 4/2002 | Pregenzer et al. |
| 6,375,437 B1 | 4/2002 | Nolan |
| 6,383,262 B1 | 5/2002 | Marthinsen et al. |

(56) References Cited

U.S. PATENT DOCUMENTS

| | | | |
|---|---|---|---|
| 6,390,789 B1 | 5/2002 | Grob et al. |
| 6,394,764 B1 | 5/2002 | Samurin |
| 6,398,400 B1 | 6/2002 | Nienhaus |
| 6,398,973 B1 | 6/2002 | Saunders et al. |
| 6,402,385 B1 | 6/2002 | Hayakawa et al. |
| 6,402,465 B1 | 6/2002 | Maier |
| 6,426,010 B1 | 7/2002 | Lecoffre et al. |
| 6,464,469 B1 | 10/2002 | Grob et al. |
| 6,467,988 B1 | 10/2002 | Czachor et al. |
| 6,468,426 B1 | 10/2002 | Klass |
| 6,485,536 B1 | 11/2002 | Masters |
| 6,530,484 B1 | 3/2003 | Bosman |
| 6,530,979 B2 | 3/2003 | Firey |
| 6,531,066 B1 | 3/2003 | Saunders et al. |
| 6,537,035 B2 | 3/2003 | Shumway |
| 6,540,917 B1 | 4/2003 | Rachels et al. |
| 6,547,037 B2 | 4/2003 | Kuzdzal |
| 6,559,567 B2 * | 5/2003 | Schob ............................ 310/90.5 |
| 6,592,654 B2 | 7/2003 | Brown |
| 6,596,046 B2 | 7/2003 | Conrad et al. |
| 6,599,086 B2 | 7/2003 | Soja |
| 6,607,348 B2 | 8/2003 | Jean |
| 6,609,882 B2 | 8/2003 | Urlichs |
| 6,616,719 B1 | 9/2003 | Sun et al. |
| 6,617,731 B1 | 9/2003 | Goodnick |
| 6,617,733 B1 | 9/2003 | Yamauchi et al. |
| 6,629,825 B2 | 10/2003 | Stickland et al. |
| 6,631,617 B1 | 10/2003 | Dreiman et al. |
| 6,637,942 B2 | 10/2003 | Dourlens et al. |
| 6,658,986 B2 | 12/2003 | Pitla et al. |
| 6,659,143 B1 | 12/2003 | Taylor et al. |
| 6,666,134 B2 | 12/2003 | Gusching et al. |
| 6,669,845 B2 | 12/2003 | Klass |
| 6,688,802 B2 | 2/2004 | Ross et al. |
| 6,707,200 B2 | 3/2004 | Carroll et al. |
| 6,718,955 B1 | 4/2004 | Knight |
| 6,719,830 B2 | 4/2004 | Illingworth et al. |
| 6,764,284 B2 | 7/2004 | Oehman, Jr. |
| 6,770,993 B1 | 8/2004 | Heshmat et al. |
| 6,776,812 B2 | 8/2004 | Komura et al. |
| 6,802,693 B2 | 10/2004 | Reinfeld et al. |
| 6,802,881 B2 | 10/2004 | Illingworth et al. |
| 6,810,311 B2 | 10/2004 | Winner et al. |
| 6,811,713 B2 | 11/2004 | Arnaud |
| 6,817,846 B2 | 11/2004 | Bennitt |
| 6,837,913 B2 | 1/2005 | Schilling et al. |
| 6,843,836 B2 | 1/2005 | Kitchener |
| 6,846,158 B2 | 1/2005 | Hull |
| 6,878,187 B1 | 4/2005 | Hays et al. |
| 6,893,208 B2 | 5/2005 | Frosini et al. |
| 6,907,933 B2 | 6/2005 | Choi et al. |
| 6,957,945 B2 | 10/2005 | Tong et al. |
| 6,966,746 B2 | 11/2005 | Cardenas et al. |
| 6,979,358 B2 | 12/2005 | Ekker |
| 6,987,339 B2 | 1/2006 | Adams et al. |
| 7,001,448 B1 | 2/2006 | West |
| 7,004,719 B2 | 2/2006 | Baldassarre et al. |
| 7,013,978 B2 | 3/2006 | Appleford et al. |
| 7,018,104 B2 | 3/2006 | Dourlens et al. |
| 7,022,150 B2 | 4/2006 | Borgstrom et al. |
| 7,022,153 B2 | 4/2006 | McKenzie |
| 7,025,890 B2 | 4/2006 | Moya |
| 7,033,410 B2 | 4/2006 | Hilpert et al. |
| 7,033,411 B2 | 4/2006 | Carlsson et al. |
| 7,048,495 B2 | 5/2006 | Osgood |
| 7,056,363 B2 | 6/2006 | Carlsson et al. |
| 7,063,465 B1 | 6/2006 | Wilkes et al. |
| 7,112,036 B2 | 9/2006 | Lubell et al. |
| 7,131,292 B2 | 11/2006 | Ikegami et al. |
| 7,144,226 B2 | 12/2006 | Pugnet et al. |
| 7,159,723 B2 | 1/2007 | Hilpert et al. |
| 7,160,518 B2 | 1/2007 | Chen et al. |
| 7,169,305 B2 | 1/2007 | Gomez |
| 7,185,447 B2 | 3/2007 | Arbeiter |
| 7,204,241 B2 | 4/2007 | Thompson |
| 7,240,583 B2 | 7/2007 | Wingett et al. |
| 7,241,392 B2 | 7/2007 | Maier |
| 7,244,111 B2 | 7/2007 | Suter et al. |
| 7,258,713 B2 | 8/2007 | Eubank et al. |
| 7,264,430 B2 | 9/2007 | Bischof et al. |
| 7,270,145 B2 | 9/2007 | Koezler |
| 7,288,202 B2 | 10/2007 | Maier |
| 7,314,560 B2 | 1/2008 | Yoshida et al. |
| 7,323,023 B2 | 1/2008 | Michele et al. |
| 7,328,749 B2 | 2/2008 | Reitz |
| 7,335,313 B2 | 2/2008 | Moya |
| 7,352,090 B2 | 4/2008 | Gustafson et al. |
| 7,367,713 B2 | 5/2008 | Swann et al. |
| 7,377,110 B2 | 5/2008 | Sheridan et al. |
| 7,381,235 B2 | 6/2008 | Koene et al. |
| 7,396,373 B2 | 7/2008 | Lagerstedt et al. |
| 7,399,412 B2 | 7/2008 | Keuschnigg |
| 7,403,392 B2 | 7/2008 | Attlesey et al. |
| 7,429,811 B2 | 9/2008 | Palazzolo et al. |
| 7,435,290 B2 | 10/2008 | Lane et al. |
| 7,445,653 B2 | 11/2008 | Trautmann et al. |
| 7,470,299 B2 | 12/2008 | Han et al. |
| 7,473,083 B2 | 1/2009 | Oh et al. |
| 7,479,171 B2 | 1/2009 | Cho et al. |
| 7,494,523 B2 | 2/2009 | Oh et al. |
| 7,501,002 B2 | 3/2009 | Han et al. |
| 7,517,155 B2 | 4/2009 | Stout et al. |
| 7,520,210 B2 | 4/2009 | Theodore, Jr. et al. |
| 7,575,422 B2 | 8/2009 | Bode et al. |
| 7,578,863 B2 | 8/2009 | Becker et al. |
| 7,591,882 B2 | 9/2009 | Harazim |
| 7,594,941 B2 | 9/2009 | Zheng et al. |
| 7,594,942 B2 | 9/2009 | Polderman |
| 7,610,955 B2 | 11/2009 | Irwin, Jr. |
| 7,628,836 B2 | 12/2009 | Baronet et al. |
| 7,637,699 B2 | 12/2009 | Albrecht |
| 7,674,377 B2 | 3/2010 | Crew |
| 7,677,308 B2 | 3/2010 | Kolle |
| 7,694,540 B2 | 4/2010 | Ishida et al. |
| 7,703,290 B2 | 4/2010 | Bladon et al. |
| 7,703,432 B2 | 4/2010 | Shaffer |
| 7,708,537 B2 | 5/2010 | Bhatia et al. |
| 7,708,808 B1 | 5/2010 | Heumann |
| 7,744,663 B2 | 6/2010 | Wallace |
| 7,748,079 B2 | 7/2010 | McDowell et al. |
| 7,766,989 B2 | 8/2010 | Lane et al. |
| 7,811,344 B1 | 10/2010 | Duke et al. |
| 7,811,347 B2 | 10/2010 | Carlsson et al. |
| 7,815,415 B2 | 10/2010 | Kanezawa et al. |
| 7,824,458 B2 | 11/2010 | Borgstrom et al. |
| 7,824,459 B2 | 11/2010 | Borgstrom et al. |
| 7,836,601 B2 | 11/2010 | El-Shafei |
| 7,846,228 B1 | 12/2010 | Saaski et al. |
| 7,850,427 B2 | 12/2010 | Peer et al. |
| 7,884,521 B2 | 2/2011 | Buhler et al. |
| 7,963,160 B2 | 6/2011 | Bisgaard |
| 8,006,544 B2 | 8/2011 | Holmes et al. |
| 8,061,970 B2 | 11/2011 | Maier et al. |
| 8,109,168 B2 | 2/2012 | Wurm et al. |
| 8,118,570 B2 | 2/2012 | Meacham et al. |
| 8,182,153 B2 | 5/2012 | Singh et al. |
| 8,191,410 B2 | 6/2012 | Hansen et al. |
| 8,283,825 B2 | 10/2012 | Maier |
| 8,353,633 B2 | 1/2013 | Griffin |
| 8,535,022 B2 | 9/2013 | Takei et al. |
| 2002/0009361 A1 | 1/2002 | Reichert et al. |
| 2002/0197150 A1 | 12/2002 | Urlichs |
| 2003/0029318 A1 | 2/2003 | Firey |
| 2003/0035718 A1 | 2/2003 | Langston et al. |
| 2003/0136094 A1 | 7/2003 | Illingworth et al. |
| 2003/0212476 A1 | 11/2003 | Aanen et al. |
| 2004/0007261 A1 | 1/2004 | Cornwell |
| 2004/0024565 A1 | 2/2004 | Yu et al. |
| 2004/0047526 A1 | 3/2004 | DeWachter et al. |
| 2004/0061500 A1 | 4/2004 | Lou et al. |
| 2004/0086376 A1 | 5/2004 | Baldassarre et al. |
| 2004/0101395 A1 | 5/2004 | Tong et al. |
| 2004/0117088 A1 | 6/2004 | Dilger |
| 2004/0170505 A1 | 9/2004 | Lenderink et al. |

(56) References Cited

U.S. PATENT DOCUMENTS

| | | |
|---|---|---|
| 2004/0179961 A1 | 9/2004 | Pugnet et al. |
| 2004/0189124 A1 | 9/2004 | Baudelocque et al. |
| 2005/0008271 A1 | 1/2005 | Lee |
| 2005/0106015 A1 | 5/2005 | Osgood |
| 2005/0173337 A1 | 8/2005 | Costinel |
| 2006/0065609 A1 | 3/2006 | Arthur |
| 2006/0090430 A1 | 5/2006 | Trautman et al. |
| 2006/0096933 A1 | 5/2006 | Maier |
| 2006/0140747 A1 | 6/2006 | Vandervort et al. |
| 2006/0157251 A1 | 7/2006 | Stinessen et al. |
| 2006/0157406 A1 | 7/2006 | Maier |
| 2006/0177166 A1 | 8/2006 | Stadlmayer et al. |
| 2006/0186671 A1 | 8/2006 | Honda et al. |
| 2006/0193728 A1 | 8/2006 | Lindsey et al. |
| 2006/0204153 A1 | 9/2006 | Alam et al. |
| 2006/0222515 A1 | 10/2006 | Delmotte et al. |
| 2006/0230933 A1 | 10/2006 | Harazim |
| 2006/0239831 A1 | 10/2006 | Garris, Jr. |
| 2006/0254659 A1 | 11/2006 | Bellott et al. |
| 2006/0275160 A1 | 12/2006 | Leu et al. |
| 2007/0029091 A1 | 2/2007 | Stinessen et al. |
| 2007/0036476 A1 | 2/2007 | Lane |
| 2007/0036646 A1 | 2/2007 | Nguyen et al. |
| 2007/0051245 A1 | 3/2007 | Yun |
| 2007/0051576 A1 | 3/2007 | Shimoda et al. |
| 2007/0062374 A1 | 3/2007 | Kolle |
| 2007/0065317 A1 | 3/2007 | Stock |
| 2007/0084340 A1 | 4/2007 | Dou et al. |
| 2007/0122265 A1 | 5/2007 | Ansari et al. |
| 2007/0140870 A1 | 6/2007 | Fukanuma et al. |
| 2007/0151922 A1 | 7/2007 | Mian |
| 2007/0163215 A1 | 7/2007 | Lagerstadt |
| 2007/0172363 A1 | 7/2007 | Laboube et al. |
| 2007/0196215 A1 | 8/2007 | Frosini et al. |
| 2007/0227969 A1 | 10/2007 | Dehaene et al. |
| 2007/0294986 A1 | 12/2007 | Beetz et al. |
| 2008/0031732 A1 | 2/2008 | Peer et al. |
| 2008/0039732 A9 | 2/2008 | Bowman |
| 2008/0095609 A1 | 4/2008 | Block et al. |
| 2008/0101918 A1 | 5/2008 | Block et al. |
| 2008/0101929 A1 | 5/2008 | Allen et al. |
| 2008/0115570 A1 | 5/2008 | Ante et al. |
| 2008/0116316 A1 | 5/2008 | Manfredotti et al. |
| 2008/0246281 A1 | 10/2008 | Agrawal et al. |
| 2008/0252162 A1 | 10/2008 | Post |
| 2008/0260539 A1 | 10/2008 | Stinessen et al. |
| 2008/0293503 A1 | 11/2008 | Vignal |
| 2008/0315812 A1 | 12/2008 | Balboul |
| 2008/0317584 A1 | 12/2008 | Murase et al. |
| 2009/0013658 A1 | 1/2009 | Borgstrom et al. |
| 2009/0015012 A1 | 1/2009 | Metzler et al. |
| 2009/0025562 A1 | 1/2009 | Hallgren et al. |
| 2009/0025563 A1 | 1/2009 | Borgstrom et al. |
| 2009/0046963 A1 | 2/2009 | Ozaki et al. |
| 2009/0151928 A1 | 6/2009 | Lawson |
| 2009/0159523 A1 | 6/2009 | McCutchen |
| 2009/0169407 A1 | 7/2009 | Yun |
| 2009/0173095 A1 | 7/2009 | Bhatia et al. |
| 2009/0173148 A1 | 7/2009 | Jensen |
| 2009/0266231 A1 | 10/2009 | Franzen et al. |
| 2009/0295244 A1 | 12/2009 | Ries |
| 2009/0302698 A1 | 12/2009 | Menz et al. |
| 2009/0304496 A1 | 12/2009 | Maier |
| 2009/0309439 A1 | 12/2009 | Yamamoto |
| 2009/0311089 A1 | 12/2009 | Begin et al. |
| 2009/0321343 A1 | 12/2009 | Maier |
| 2009/0324391 A1 | 12/2009 | Maier |
| 2010/0007133 A1 | 1/2010 | Maier |
| 2010/0007283 A1 | 1/2010 | Shimoyoshi et al. |
| 2010/0010701 A1 | 1/2010 | Gärtner |
| 2010/0021095 A1 | 1/2010 | Maier |
| 2010/0021292 A1 | 1/2010 | Maier et al. |
| 2010/0038309 A1 | 2/2010 | Maier |
| 2010/0043288 A1 | 2/2010 | Wallace |
| 2010/0043364 A1 | 2/2010 | Curien |
| 2010/0044966 A1 | 2/2010 | Majot et al. |
| 2010/0072121 A1 | 3/2010 | Maier |
| 2010/0074768 A1 | 3/2010 | Maier |
| 2010/0080686 A1 | 4/2010 | Teragaki |
| 2010/0083690 A1 | 4/2010 | Sato et al. |
| 2010/0090087 A1 | 4/2010 | Maier |
| 2010/0127589 A1 | 5/2010 | Kummeth |
| 2010/0129212 A1 | 5/2010 | Berger et al. |
| 2010/0139270 A1 | 6/2010 | Koch et al. |
| 2010/0143172 A1 | 6/2010 | Sato et al. |
| 2010/0163232 A1 | 7/2010 | Kolle |
| 2010/0180589 A1 | 7/2010 | Berger et al. |
| 2010/0183438 A1 | 7/2010 | Maier et al. |
| 2010/0239419 A1 | 9/2010 | Maier |
| 2010/0239437 A1 | 9/2010 | Maier et al. |
| 2010/0247299 A1 | 9/2010 | Maier |
| 2010/0257827 A1 | 10/2010 | Lane et al. |
| 2010/0310366 A1 | 12/2010 | Eguchi et al. |
| 2011/0017307 A1 | 1/2011 | Kidd et al. |
| 2011/0038716 A1 | 2/2011 | Frankenstein et al. |
| 2011/0044832 A1 | 2/2011 | Nijhuis |
| 2011/0052109 A1 | 3/2011 | Tecza et al. |
| 2011/0052432 A1 | 3/2011 | Cunningham et al. |
| 2011/0061536 A1 | 3/2011 | Maier et al. |
| 2011/0085752 A1 | 4/2011 | Tecza et al. |
| 2012/0106883 A1 | 5/2012 | Griffin |
| 2013/0015731 A1 | 1/2013 | Griffin et al. |

FOREIGN PATENT DOCUMENTS

| | | |
|---|---|---|
| DE | 692 17 540 T2 | 9/1997 |
| DE | 102 05 971 A1 | 11/2002 |
| EP | 1 300 600 A2 | 10/2002 |
| EP | 1 582 703 A2 | 10/2005 |
| EP | 0 875 694 B1 | 1/2006 |
| EP | 2 013 479 | 1/2009 |
| EP | 7838631.5 | 12/2009 |
| GB | 2 323 639 A | 9/1998 |
| GB | 2 337 561 A | 11/1999 |
| JP | 54099206 | 1/1978 |
| JP | H 02-96016 U | 7/1990 |
| JP | H 06-173948 A | 6/1994 |
| JP | 08-068501 A | 3/1996 |
| JP | 08-082397 | 3/1996 |
| JP | 8-284691 A | 11/1996 |
| JP | H 09-74736 A | 3/1997 |
| JP | H 10-502722 A | 3/1998 |
| JP | 2001-124062 A | 5/2001 |
| JP | 2002-106565 A | 4/2002 |
| JP | 2002-218708 A | 8/2002 |
| JP | 2002-242699 A | 8/2002 |
| JP | 2004-034017 A | 2/2004 |
| JP | 2004-340248 A | 12/2004 |
| JP | 2005-291202 A | 10/2005 |
| JP | 3711028 B2 | 10/2005 |
| JP | 2007-162726 A | 6/2007 |
| KR | 94-702296 A | 1/1994 |
| KR | 10-1996-0065432 | 12/1996 |
| KR | 10-0207986 B1 | 7/1999 |
| KR | 10-2007-0106390 | 1/2007 |
| KR | 2009-0085521 A | 8/2009 |
| MX | 2008-012579 A | 12/2008 |
| WO | WO 95/13477 A1 | 5/1995 |
| WO | WO 95/24563 A1 | 9/1995 |
| WO | WO 01/17096 A1 | 3/2001 |
| WO | WO 01/57408 A1 | 8/2001 |
| WO | WO 2006/098806 A1 | 9/2006 |
| WO | WO 2007/043889 A1 | 4/2007 |
| WO | WO 2007/047976 A1 | 4/2007 |
| WO | WO 2007/067169 A1 | 6/2007 |
| WO | WO 2007/103248 A2 | 9/2007 |
| WO | WO 2007/120506 A3 | 10/2007 |
| WO | WO 2008/036221 A3 | 3/2008 |
| WO | WO 2008/036394 A3 | 3/2008 |
| WO | WO 2008/039446 A3 | 4/2008 |
| WO | WO 2008/039491 A3 | 4/2008 |
| WO | WO 2008/039731 A3 | 4/2008 |
| WO | WO 2008/039732 A3 | 4/2008 |
| WO | WO 2008/039733 A2 | 4/2008 |

(56) References Cited

FOREIGN PATENT DOCUMENTS

| WO | WO 2008/039734 A3 | 4/2008 |
|---|---|---|
| WO | WO 2009/111616 A3 | 9/2009 |
| WO | WO 2009/158252 A1 | 12/2009 |
| WO | WO 2009/158253 A1 | 12/2009 |
| WO | WO 2010/083416 A1 | 7/2010 |
| WO | WO 2010/083427 A1 | 7/2010 |
| WO | WO 2010/107579 A1 | 9/2010 |
| WO | WO 2010/110992 A1 | 9/2010 |
| WO | WO 2011/034764 A2 | 3/2011 |
| WO | WO 2011/044423 A2 | 4/2011 |
| WO | WO 2011/044428 A2 | 4/2011 |
| WO | WO 2011/044430 A2 | 4/2011 |
| WO | WO 2011/044432 A2 | 4/2011 |
| WO | WO 2011/088004 A2 | 7/2011 |
| WO | WO 2012/030459 A1 | 3/2012 |
| WO | WO 2012/138545 A2 | 10/2012 |
| WO | WO 2012/158266 A2 | 11/2012 |
| WO | WO 2012/166236 A1 | 12/2012 |

OTHER PUBLICATIONS

Atlas Bronze, "Graphite Lubricated Bearings," Website, 2 pages.
de Jongh, Frits, "The Synchronous Rotor Instability Phenomenon—Morton Effect," TurboCare B.V., Hengelo, The Netherlands, Proceedings of the 37th Turbomachinery Symposium, 2008, 9 pages.
Eichenberg, Dennis J., et al., "Development of a 32 Inch Diameter Levitated Ducted Fan Conceptual Design," (NASA/TM-2006-214481), *NASA*, Glenn Research Center, Cleveland, OH, Dec. 2006, 40 pages.
Liu, Kefu; Liu, Jie, and Liao, Liang, "Application of a Tunable Electromagnetic Damper in Suppression of Structural Vibration," (No. 04-CSME-49), *Department of Mechanical Engineering*, Lakehead University, Thunder Bay, Ontario Canada, received Oct. 2004, 21 pages.
Rodwell, E., "Auxiliary Bearings in Vertically Oriented Machines on Magnetic Bearings," (1003177), *EPRI*, Palo Alto, CA, 2001, 104 pages.
EP 03 00 9732—European Search Report, dated Sep. 9, 2003, 1 page.
EP 05 000 410.0—European Search Report, dated Mar. 9, 2005, 5 pages.
EP 03 009 732.3—Communication Pursuant to Article 96(2), dated Mar. 15, 2005, 1 page.
EP 06 817 242—Extended Supplementary European Search Report, dated Aug. 7, 2009, 3 pages.
EP 06 817 242—Supplementary European Search Report, dated Aug. 25, 2009, 1 page.
PCT/US2006/041127—International Preliminary Report on Patentability, Written Opinion of the International Searching Authority, issued Apr. 30, 2008, 4 pages.
PCT/US06/41127—Written Opinion of the International Searching Authority, mailed Mar. 19, 2007, 3 pages.
PCT/US2007/008149—International Preliminary Report on Patentability, issued Sep. 30, 2008, 4 pages.
PCT/US2007/008149—Written Opinion of the International Searching Authority, mailed Jul. 17, 2008, 3 pages.
PCT/US2007/020101—International Preliminary Report on Patentability, issued Mar. 24, 2009, 8 pages.
PCT/US2007/020101—Written Opinion of the International Searching Authority, mailed Apr. 29, 2008, 7 pages.
PCT/US2007/020471—International Preliminary Report on Patentability, issued Mar. 24, 2009, 6 pages.
PCT/US2007/020471—Written Opinion of the International Searching Authority, mailed Apr. 1, 2008, 5 pages.
PCT/US2007/020659—International Preliminary Report on Patentability, issued Mar. 31, 2009, 4 pages.
PCT/US2007/020659—Written Opinion of the International Searching Authority, mailed Sep. 17, 2008, 3 pages.
PCT/US2007/020768—International Preliminary Report on Patentability, issued Mar. 31, 2009, 8 pages.
PCT/US2007/020768—Written Opinion of the International Searching Authority, mailed Mar. 3, 2008, 7 pages.
PCT/US2007/079348—International Preliminary Report on Patentability, issued Mar. 31, 2009, 5 pages.
PCT/US2007/079348—Written Opinion of the International Searching Authority, mailed Apr. 11, 2008, 4 pages.
PCT/US2007/079349—International Preliminary Report on Patentability, issued Mar. 31, 2009, 5 pages.
PCT/US2007/079349—Written Opinion of the International Searching Authority, mailed Apr. 2, 2008, 4 pages.
PCT/US2007/079350—International Preliminary Report on Patentability, issued Mar. 31, 2009, 6 pages.
PCT/US2007/079350—International Search Report, mailed Apr. 2, 2008, 1 page.
PCT/US2007/079350—Written Opinion of the International Searching Authority, mailed Apr. 2, 2008, 5 pages.
PCT/US2007/079352—International Preliminary Report on Patentability, issued Mar. 31, 2009, 4 pages.
PCT/US2007/079352—Written Opinion of the International Searching Authority, mailed Apr. 27, 2008, 3 pages.
PCT/US2009/036142—International Preliminary Report on Patentability, issued Sep. 7, 2010, 8 pages.
PCT/US2009/036142—Notification of Transmittal of International Search Report and Written Opinion of International Searching Authority, International Search Report, mailed May 11, 2009, 3 pages.
PCT/US2009/036142—Written Opinion of the International Searching Authority, mailed May 11, 2009, 7 pages.
PCT/US2009/047662—International Preliminary Report on Patentability, issued Jan. 5, 2011, 6 pages.
PCT/US2009/047662—Written Opinion of the International Searching Authority, mailed Aug. 20, 2009, 5 pages.
PCT/US2009/047667—International Report on Patentability, issued Jan. 5, 2011, 5 pages.
PCT/US2009/047667—Written Opinion of the International Searching Authority, mailed Aug. 7, 2009, 4 pages.
PCT/US2009/047667—Notification of Transmittal of International Search Report and Written Opinion of the International Searching Authority, International Search Report, mailed Aug. 7, 2009, 3 pages.
PCT/US2010/021199—Notification of Transmittal of International Search Report and Written Opinion of International Searching Authority, International Search Report, Written Opinion of the International Searching Authority, mailed Mar. 22, 2010, 6 pages.
PCT/US2010/021199—International Preliminary Report on Patentability, issued Feb. 7, 2011, 10 pages.
PCT/US2010/021218—Notification of Transmittal of International Search Report and Written Opinion of International Searching Authority, International Search Report, Written Opinion of the International Searching Authority, mailed Mar. 23, 2010, 7 pages.
PCT/US2010/021218—International Report on Patentability, issued Jan. 26, 2011, 7 pages.
PCT/US2010/025650—Notification of Transmittal of International Search Report and Written Opinion of the International Searching Authority, International Search Report, Written Opinion of the International Searching Authority, mailed Apr. 22, 2010, 8 pages.
PCT/US2010/025650—International Report on Patentability, issued Mar. 3, 2011, 8 pages.
PCT/US2010/025952—Notification of Transmittal of International Search Report and Written Opinion of the International Searching Authority, International Search Report, Written Opinion of the International Searching Authority, mailed Apr. 12, 2010, 8 pages.
PCT/US2010/025952—International Report on Patentability, issued Mar. 4, 2011, 8 pages.
PCT/US2010/051922—Notification of Transmittal of International Search Report and Written Opinion of the International Searching Authority, International Search Report, Written Opinion of the International Searching Authority, mailed Jun. 30, 2011, 8 pages.
PCT/US2010/051927—Notification of Transmittal of International Search Report and Written Opinion of the International Searching Authority, International Search Report, Written Opinion of the International Searching Authority, mailed Jun. 30, 2011, 8 pages.
PCT/US2010/051930—Notification of Transmittal of International Search Report and Written Opinion of the International Searching Authority, International Search Report, Written Opinion of the International Searching Authority, mailed Jun. 30, 2011, 8 pages.

(56) References Cited

OTHER PUBLICATIONS

PCT/US2010/051932—Notification of Transmittal of International Search Report and Written Opinion of the International Searching Authority, International Search Report, Written Opinion of the International Searching Authority, mailed Jun. 30, 2011, 8 pages.
PCT/US2011/020746—Notification of Transmittal of International Search Report and Written Opinion of the International Searching Authority, International Search Report, Written Opinion of the International Searching Authority, mailed Sep. 23, 2011, 8 pages.
PCT/US2011/046045—Notification of Transmittal of International Search Report and Written Opinion of the International Searching Authority, International Search Report, Written Opinion of the International Searching Authority, mailed Feb. 17, 2012, 10 pages.
PCT/US2011/045987—Notification of Transmittal of International Search Report and Written Opinion of the International Searching Authority, International Search Report, Written Opinion of the International Searching Authority, mailed Mar. 21, 2012, 10 pages.
PCT/US2012/031237—International Search Report, Written Opinion of the International Searching Authority, mailed Nov. 1, 2012, 6 pages.
PCT/US2012/031240—Notification of Transmittal of International Search Report and Written Opinion of the International Searching Authority, International Search Report, Written Opinion of the International Searching Authority, mailed Oct. 19, 2012, 8 pages.
PCT/US12/31345—Notification of Transmittal of International Preliminary Report on Patentability, International Preliminary Report on Patentability, mailed May 20, 2013, 16 pages.
PCT/US2012/031345—Notification of Transmittal of International Search Report and Written Opinion of the International Searching Authority, International Search Report, Written Opinion of the International Searching Authority, mailed Oct. 31, 2012, 11 pages.

* cited by examiner

METHOD FOR ON-LINE DETECTION OF RESISTANCE-TO-GROUND FAULTS IN ACTIVE MAGNETIC BEARING SYSTEMS

This application claims priority to U.S. Patent Application Ser. No. 61/428,429, which was filed Dec. 30, 2010. The priority application is hereby incorporated by reference in its entirety into the present application.

BACKGROUND

A motor can be combined with a compressor in a single housing to provide a motor-compressor system. Using a shared shaft, or two or more shafts coupled together, the motor drives the compressor in order to generate a flow of compressed process gas. In hermetically-sealed motor-compressors, the shaft is typically supported by two or more radial magnetic journal bearings and often includes at least one axial magnetic bearing for thrust compensation. The magnetic bearings may be passive magnetic bearing systems using permanent magnets, or they may include active magnetic bearing systems having one or more electromagnets actively controlled by an external power source adapted to centralize or otherwise levitate the shaft.

Magnetic bearings installed within a hermetically-sealed motor-compressor are typically pressurized to a level close to the process inlet pressure, and cooled by process gas derived from the compressor and circulated via a cooling loop. Although the cooling process gas is ordinarily first treated in a gas conditioning skid to remove contaminants and free liquids, there is still potential for the generation and accumulation of liquids within the cooling loop. For example, liquids such as water, hydrocarbon condensate, or other wellstream fluids can often form, and magnetic bearings are particularly susceptible to damage if they come into contact with these liquids or "dirty" cooling process gas. In such cases, the resistance to ground of the electrical windings of the bearings may be reduced which, if not reversed or at least stopped, could eventually lead to the complete failure of the bearing.

One way to protect the electrical windings from liquid penetration is the application of vacuum-pressure impregnation (VPI) to the windings which provides a protective coating that insulates the windings. Magnetic bearings, however, are subjected to repeated pressurization-depressurization cycles which increase the risk of liquids penetrating the VPI coating over time. Once the VPI coating is penetrated, the bearing coil resistance to ground gradually diminishes, and if the liquid penetration is not reversed or stopped, the coil resistance to ground will eventually become zero, thereby causing the bearing to short out and fail.

What is needed, therefore, is a method and system for monitoring the bearing coil resistance to ground as an indicator of the accumulation of liquids in the cooling loop of a motor-compressor, and more particularly within the magnetic bearings.

SUMMARY OF THE INVENTION

Embodiments of the disclosure may provide a magnetic bearing. The magnetic bearing may include a stator having a plurality of protrusions extending radially-inward therefrom and electrical windings wound about each protrusion to form a corresponding plurality of bearing coils, the plurality of bearing coils being disposed within an insulative coating adapted to protect against the ingress of liquids. The magnetic bearing may also include a controller communicable with the electrical windings and configured to control an electrical current in each bearing coil to maintain a rotor centered within the stator, and a sensing wire coupled to at least one of the plurality of bearing coils and also disposed within the insulative coating. The magnetic bearing may further include a sensing device communicably coupled to the sensing wire and configured monitor a resistance to ground of the sensing wire, wherein the resistance to ground of the sensing wire is indicative of a resistance to ground of the at least one the plurality of bearing coils.

Embodiments of the disclosure may further provide a method of operating a magnetic bearing. The method may include circulating a cooling gas through a bearing cavity where the magnetic bearing is arranged, the magnetic bearing having a circular stator with a plurality of coils extending radially-inward therefrom, the plurality coils having an insulative coating disposed thereon to protect against the ingress of liquids, and sensing a first resistance to ground with a sensing wire coupled to the first coil, the sensing wire also having the insulative coating disposed thereon. The method may further include monitoring the first resistance to ground as the insulative coating degrades over time, the first resistance to ground being monitored with a sensing device communicably coupled to the sensing wire, and wherein the first resistance to ground is indicative of a resistance to ground of the first coil.

Embodiments of the disclosure may further provide another magnetic bearing. The magnetic bearing may include a circular stator having a plurality of magnetic pole pairs spaced about the stator and extending radially-inward therefrom, each magnetic pole pair comprising a pair of adjacent bearing coils protected against the ingress of liquids by an insulative coating, and a sensing wire coupled to a first magnetic pole pair, the first magnetic pole pair being arranged at the bottom of the stator, wherein the sensing wire is also disposed within the insulative coating. The magnetic bearing may further include a sensing device communicably coupled to the sensing wire and configured to monitor a resistance to ground of the sensing wire as the insulative coating degrades over time, wherein the resistance to ground of the sensing wire is indicative of a resistance to ground of the first magnetic pole pair.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
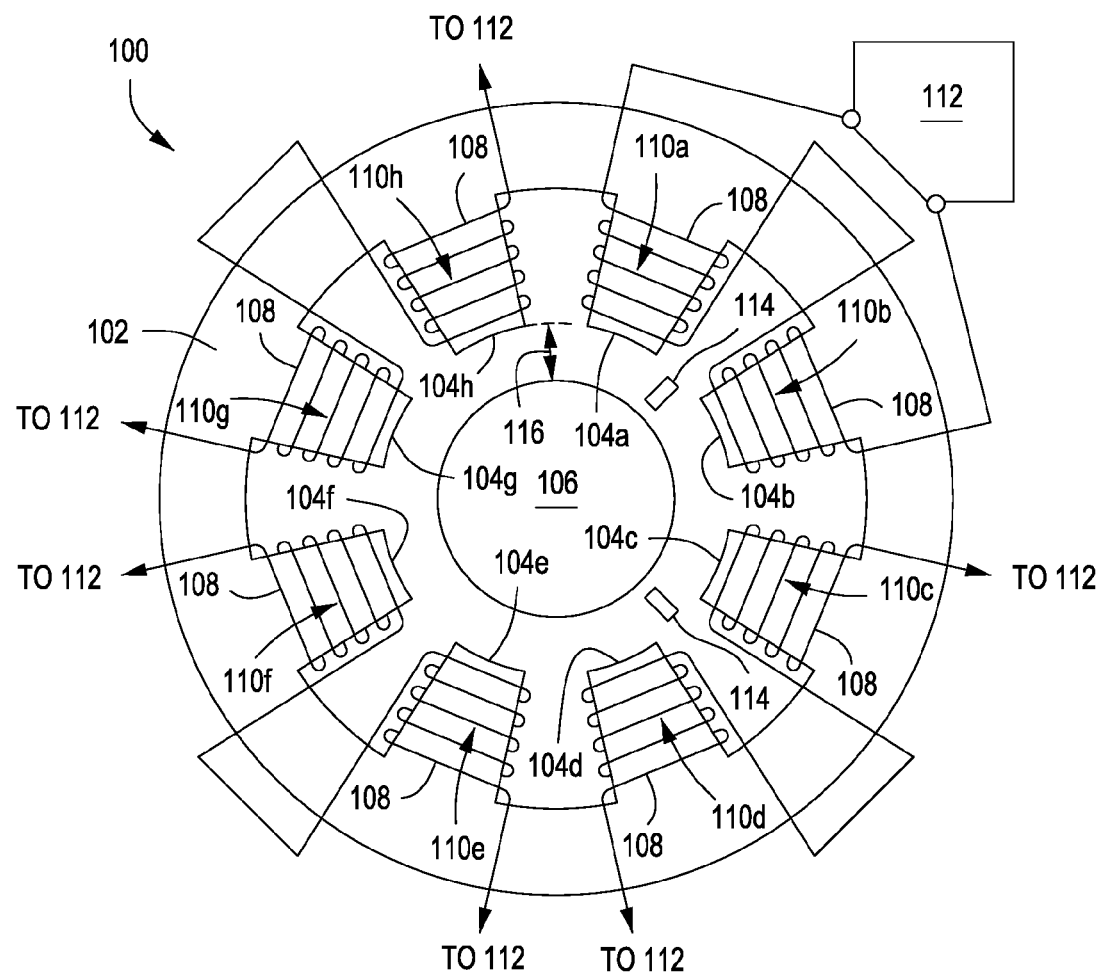
FIG. 1 depicts an illustrative radial magnetic bearing, according to one or more embodiments disclosed.

It is to be understood that the following disclosure describes several exemplary embodiments for implementing different features, structures, or functions of the invention. Exemplary embodiments of components, arrangements, and configurations are described below to simplify the present disclosure; however, these exemplary embodiments are provided merely as examples and are not intended to limit the scope of the invention. Additionally, the present disclosure may repeat reference numerals and/or letters in the various exemplary embodiments and across the Figures provided herein. This repetition is for the purpose of simplicity and clarity and does not in itself dictate a relationship between the various exemplary embodiments and/or configurations discussed in the various Figures. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Finally, the exemplary embodiments presented below may be combined in any combination of ways, i.e., any element from one exemplary embodiment may be used in any other exemplary embodiment, without departing from the scope of the disclosure.

Additionally, certain terms are used throughout the following description and claims to refer to particular components. As one skilled in the art will appreciate, various entities may refer to the same component by different names, and as such, the naming convention for the elements described herein is not intended to limit the scope of the invention, unless otherwise specifically defined herein. Further, the naming convention used herein is not intended to distinguish between components that differ in name but not function. Additionally, in the following discussion and in the claims, the terms "including" and "comprising" are used in an open-ended fashion, and thus should be interpreted to mean "including, but not limited to." All numerical values in this disclosure may be exact or approximate values unless otherwise specifically stated. Accordingly, various embodiments of the disclosure may deviate from the numbers, values, and ranges disclosed herein without departing from the intended scope. Furthermore, as it is used in the claims or specification, the term "or" is intended to encompass both exclusive and inclusive cases, i.e., "A or B" is intended to be synonymous with "at least one of A and B," unless otherwise expressly specified herein.

FIG. 1 illustrates an exemplary radial magnetic bearing 100, according to one or more embodiments disclosed. In one embodiment, the radial magnetic bearing 100 may be an active magnetic bearing having a circular stator 102 with a plurality of protrusions 104a-104h extending radially-inward therefrom. The protrusions 104a-h may be spaced about the circumference of the stator 102 and be configured to surround a centrally-disposed shaft or rotor 106. In an embodiment, the rotor 106 may be arranged within a hermetically-sealed motor-compressor and the magnetic bearing 100 may be configured to levitate the rotor 106 during operation. As will be appreciated, however, the rotor 106 may be arranged in various types of machinery, including turbomachinery, without departing from the scope of the disclosure.

As illustrated, the protrusions 104a-h may be equidistantly-spaced about the stator 102. It is also contemplated, however, to have protrusions 104a-h spaced at predetermined intervals but not necessarily equidistant from each other. While FIG. 1 depicts a total of eight protrusions 104a-h, it will be appreciated that the number of protrusions 104a-h may vary to suit any particular application, without departing from the scope of the disclosure.

Each protrusion 104a-h may include a plurality of electrical windings 108 wound thereabout multiple times in order to create a corresponding plurality of coils 110a-110h or magnetic "poles." Accordingly, the depicted magnetic bearing 100 includes a total of eight magnetic poles. Similar to the number of protrusions 104a-h, it will be appreciated that the number of magnetic poles may vary to suit any particular application, without departing from the scope of the disclosure.

The electrical windings 108 may be made of an electrically-conductive material insulated on its exterior surface with, for example, a plastic or Teflon® coating. Via the windings 108, the coils 110a-h are placed in electrical communication with a controller 112. The controller 112 receives signals from one or more rotor position sensors 114 and processes the signals to calculate how to redistribute electromagnetic currents in each coil 110a-h in order to keep the rotor 106 centered within a clearance gap 116 defined between the stator 102 and the rotor 106. In operation, the windings 108 generate an electromagnetic field between the stator 102 and the rotor 106 that levitates and stabilizes the rotor 106.

In one embodiment, the coils 110a-h may be generally insulated against the ingress of liquids, chemicals, and other contaminants. In one embodiment, the coils 110a-h are protected via an insulative coating applied using vacuum pressure impregnation (VPI). The VPI process entails submerging the stator 102, including the windings 108 and coils 110a-h, in a resin, such as a solvent-less epoxy resin. Through a combination of vacuum/pressure cycles and thermal processing, the impregnated windings 108 become a void-free and homogeneous structure having higher dielectric strength and increased thermal conductivity. As will be appreciated by those skilled in the art, however, the windings 108 may be insulated or otherwise protected using various other techniques besides VPI, without departing from the scope of the disclosure.

Over time, the VPI coating (or a similar insulative coating) on the coils 110a-h may degrade, thereby exposing the coils 110a-h to liquids or other contaminants. This is especially true in magnetic bearings where the environment is pressurized and depressurized routinely, and liquids are therefore intermittently forced into miniscule pores or cracks propagated in the VPI coating. Once the coils 110a-h become wet, the resistance to ground (e.g., the stator 102 or surrounding machinery) of the windings 108 gradually diminishes and if not remedied will eventually go to zero, thereby resulting in the failure of the magnetic bearing 100. As can be appreciated, failure of a magnetic bearing during operation can severely damage the rotor 106 and potentially have catastrophic effects on the motor-compressor as a whole.

Figure 2:
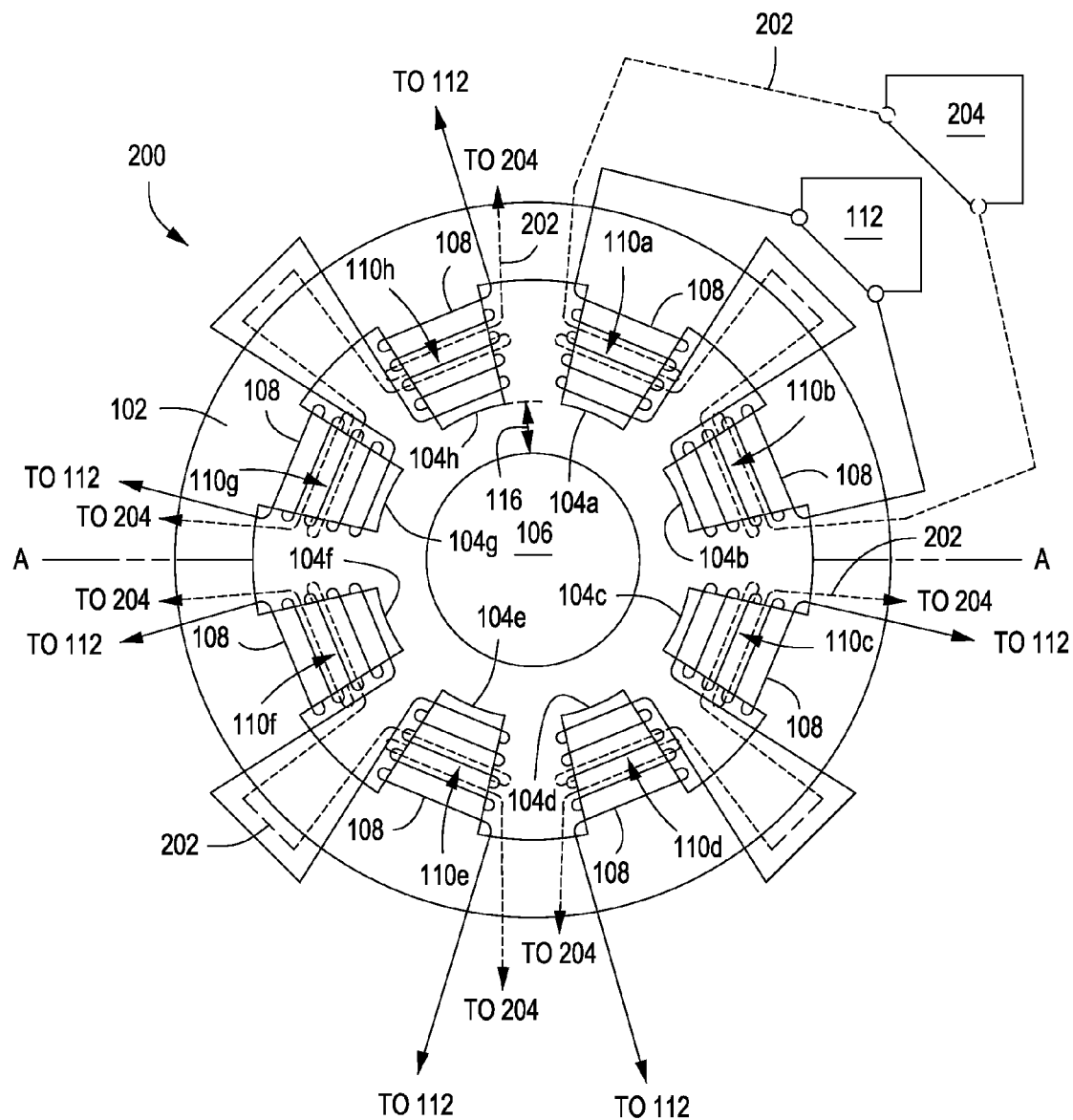
FIG. 2 depicts another illustrative radial magnetic bearing configured to monitor the resistance to ground, according to one or more embodiments disclosed.

Referring now to FIG. 2, illustrated is another exemplary radial magnetic bearing 200, similar in some respects to the radial magnetic bearing 100 of FIG. 1. Accordingly, the radial magnetic bearing 200 may be best understood with reference to FIG. 1, where like numerals correspond to like components and therefore will not be described again in detail. As illustrated in FIG. 2, one or more sensing wires 202 may be coupled to or otherwise wrapped around the coils 110a-h. Briefly, and as will be described in more detail below, the sensing wire 202 may be adapted to sense/detect the presence of liquids within the magnetic bearing 200, thereby indicating an equivalent resistance to ground for each coil 110a-h as the VPI coating (or similar insulative coating) degrades over time. Accordingly, the sensing wires 202 may facilitate or initiate proactive management of the bearing 200 before any damage or failure to the magnetic bearing 200 transpires.

Similar to the windings 108 described above, the sensing wire 202 may also be made of an electrically-conductive material that is insulated on its external surface. The sensing wire 202 may be communicably or otherwise electrically coupled to a sensing device 204 configured to measure the resistance to ground of each sensing wire 202 and thereby provide a current or real-time reading of the resistance to ground of the coils 110a-h, as will be discussed below. In an embodiment, the sensing device 204 may be located on a control panel (not shown) for the motor-compressor and may provide an output using any conventional peripheral including, and without limitation to, a printer, a monitor, a graphical user interface, audio speakers, etc. Accordingly, the sensing wire 202 and sensing device 204 may be adapted to sense/detect liquid around the bearing coils 110a-h (e.g., a common cause of diminished resistance to ground in magnetic bearings) without having to disconnect case penetration connectors as part of an external conditioning monitoring system.

To secure or otherwise attach the sensing wire 202 to one or more of the coils 110a-h, the sensing wire 202 may be wrapped or otherwise wound around the coil 110a-h, generally similar to how the windings 108 are wrapped about each protrusion 104a-h. As shown in FIG. 2, it is contemplated to wrap the sensing wire 202 around each coil 110a-h at least two times or revolutions. However, it will be appreciated that the sensing wire 202 may be wrapped around the coil 110a-h more or less than two revolutions, and may directly depend on available space within the bearing 200 for additional turns and braze joints related to the sensing wire 202. Moreover, it will be appreciated that the sensing wire 202 may be simply coupled to the coils 110a-h in any suitable manner known to those skilled in the art.

In one embodiment, as illustrated, a single sensing wire 202 may be applied to adjacent magnetic poles of the bearing 200. For instance, a single sensing wire 202 may be wrapped around both the first coil 110a and the second coil 110b (e.g., the first magnetic pole pair), having each end of the sensing wire 202 coupled or otherwise leading to the sensing device 204. If desired, the same process may be repeated for the third coil 110c and the fourth coil 110d (e.g., the second magnetic pole pair), the fifth coil 110e and the sixth coil 110f (e.g., the third magnetic pole pair), and the seventh coil 110g and the eighth coil 110h (e.g., the fourth magnetic pole pair). In other embodiments, a single sensing wire 202 may be applied to each of the coils 110a-h in tandem, where the sensing wire 202 is wrapped around the first coil 110a, the second coil 110b, and continuing in clockwise fashion around the stator 102 until finally being wrapped around the last or eighth coil 110h. In such an embodiment, the sensing device 204 would receive a signal representative of the collective resistance to ground of the coils 110a-h. In yet other embodiments, single sensing wires 202 may be wrapped around each coil 110a-h individually, thereby providing the sensing device 204 with signals derived from each coil 110a-h individually.

In at least one embodiment, the sensing wire 202 may be wrapped around the coils 110a-h at a location where liquids and contaminants are more prone to or known to accumulate inside the magnetic bearing 200. For example, gravity will tend to force generated liquids to amass in the bottom of the magnetic bearing 200, such as, in the area of the bearing 200 below a horizontal line A. Accordingly, in one embodiment the sensing wire 202 may be applied to only the second magnetic pole pair (i.e., the third coil 110c and the fourth coil 110d) or only the third magnetic pole pair (i.e., the fifth coil 110e and the sixth coil 110f), or both, which are generally located near the bottom of the magnetic bearing 200 and therefore more susceptible to the ingress of liquids or other contaminants. In other embodiments, the sensing wire 202 may be singly coupled to either the fourth coil 110d or the fifth coil 110e, or both, since they are also located near the bottom of the magnetic bearing 200. It will be appreciated, however, that the "bottom" of the magnetic bearing 200 once installed may be relative to its general disposition in view of the horizontal line A, and may therefore be altered during maintenance or turnaround operations if the bearing 200 is re-installed in a different circumferential disposition.

In one embodiment, the sensing wire 202 is arranged on the magnetic bearing 200 prior to the application of the VPI coating (or similar insulative coating) about the coils 110a-h. Consequently, the sensing device 204 may be used to measure resistance to ground of the sensing wire 202 which is partly indicative of the degradation of the insulative coating (i.e., the VPI coating) about the coils 110a-h, and also the concomitant degradation of the insulative layer disposed about the windings 108 and the sensing wire 202 individually. For example, as the insulative coating on the coils 110a-h degrades over time, the windings 108 and the sensing wire 202 are equally exposed to liquids and other contaminants. Once exposed to the liquids and contaminants, the sensing wire 202 is configured to transmit a signal to the sensing device 204 corresponding to the resistance to ground of the sensing wire 202, which may be equally indicative of the resistance to ground of the respective coils 110a-h.

The resistance to ground of the sensing wire 202 may be monitored continuously or periodically during operation of the motor-compressor. By trending over time the diminishing resistance value of the sensing wire 202 (and thus the coils 110a-h vicariously through the sensing wire 202), the magnetic bearing 200 may be proactively managed in order to avoid potential damage or failure. For instance, once the resistance to ground of the sensing wire 202 reaches or approaches a predetermined level, such as indicating a general inability of the magnetic bearing 200 to adequately levitate the rotor 106 without adversely affecting rotordynamics or overall performance, appropriate actions may then be taken to avoid the complete failure of the magnetic bearing 200 and damage to the rotor 106. At least one appropriate action may be shutting down the motor-compressor to drain the accumulated liquids from the magnetic bearings 200 and to dry the bearings 200 for continued use.

Figure 3:
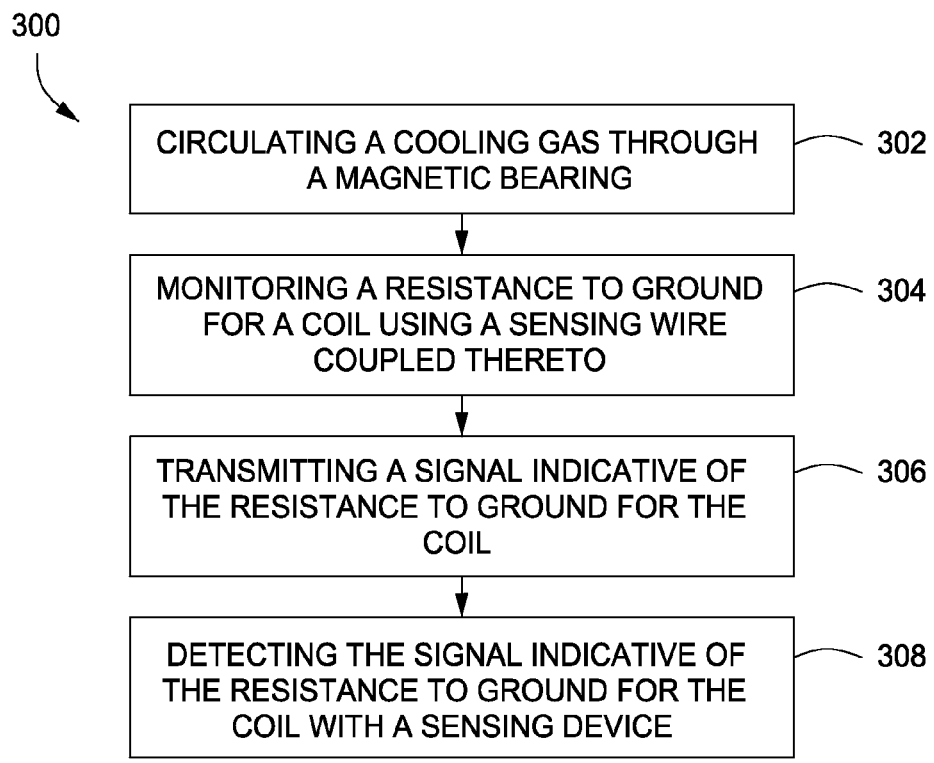
FIG. 3 depicts a schematic of a method of monitoring the resistance to ground of magnetic bearing coils, according to one or more embodiments disclosed.

Referring now to FIG. 3, depicted is a schematic of a method 300 of operating a magnetic bearing. The method 300 may include circulating a cooling gas through a magnetic bearing, as at 302. The magnetic bearing may be disposed within a bearing cavity defined within a casing, such as a casing for a turbomachine. The magnetic bearing may include a circular stator with a plurality of coils extending radially-inward therefrom, and the plurality coils may have an insulative coating disposed thereon to protect against the ingress of liquids. In at least one embodiment, the insulative coating may be a protective layer of an epoxy resin applied using VPI techniques.

The method 300 may also include sensing the resistance to ground of a coil among the plurality of coils using a sensing wire coupled thereto or otherwise wrapped thereabout, as at 304. The sensing wire may also be embedded or otherwise disposed within the insulative coating. As the insulative coating degrades over time, the sensing wire is adapted to sense and transmit a signal indicative of the resistance to ground for the coil, as at 306. Being communicably coupled to the sensing wire, a sensing device detects or otherwise monitors the signal indicative of the resistance to ground for the coil, as at 308.

Figure 4:
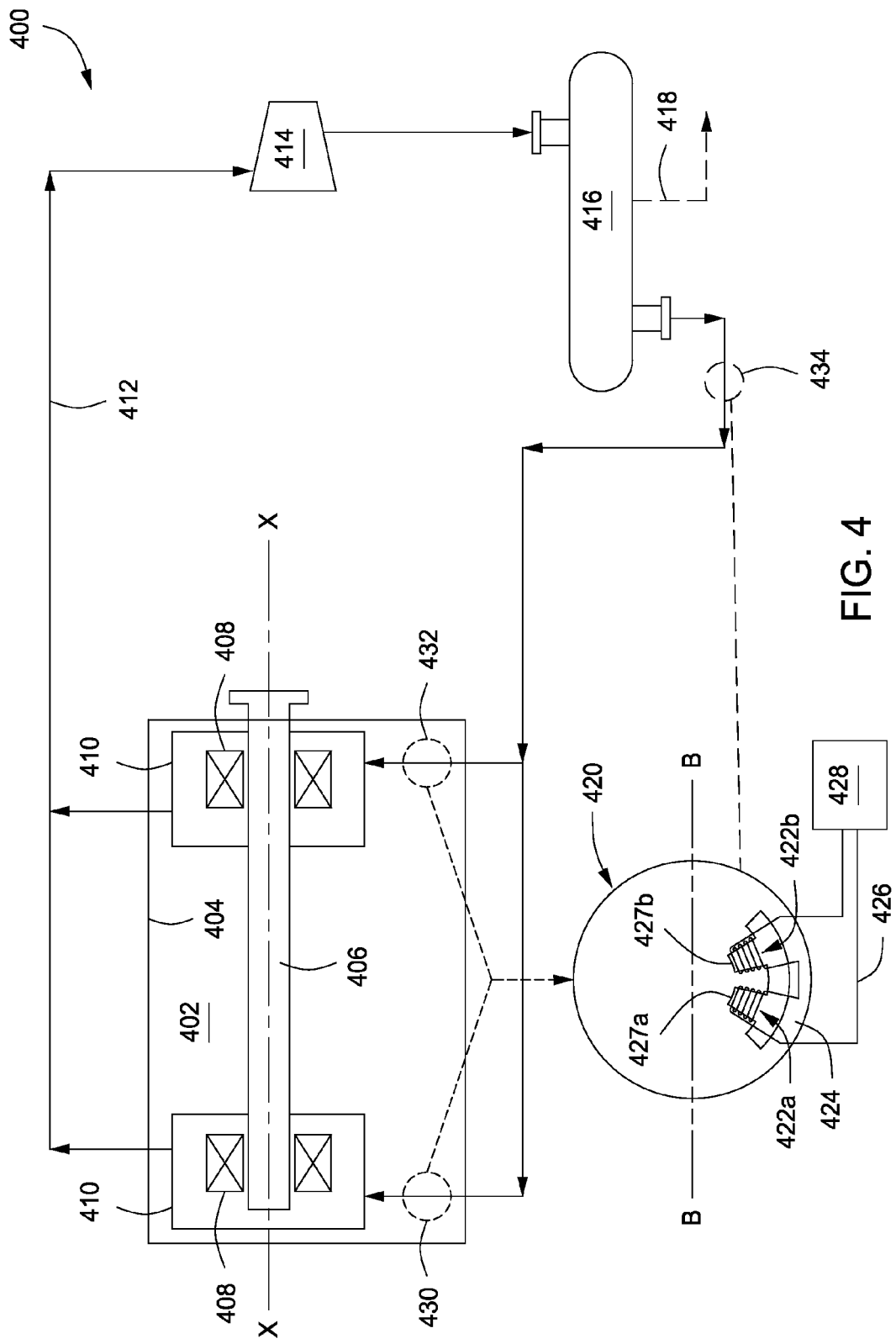
FIG. 4 depicts an illustrative system for monitoring the resistance to ground of magnetic bearing stator coils, according to one or more embodiments disclosed.

Referring now to FIG. 4, illustrated is a system 400 configured to monitor the resistance to ground of one or more magnetic bearing stator coils. The system 400 may include a compressor 402 having a housing or casing 404. While not shown, the compressor 402 may include a rotor assembly enclosed by the casing 404 and configured to rotate therein. The compressor 402 may be a motor-compressor or other fluid compression apparatus, and the casing 404 may be configured to hermetically-seal the components of the compressor 402 therein. A rotatable shaft 406 may be arranged within the casing 406 and adapted to rotate about a central axis X. In one embodiment, the ends of the shaft 406 may penetrate the casing 404 at one or both ends of the casing 404 to allow the shaft 406 to be potentially coupled to an external driver (not shown) or additional driven equipment (not shown). As will become more evident below, it will be appreciated that the compressor 402 may be any rotatable machinery or device, generally rotatable about the central axis X.

The shaft 406 may be supported at each end by one or more radial bearings 408 arranged within respective bearing cavities 410. The radial bearings 408 may be directly or indirectly supported by the casing 404, and in turn provide support to the shaft 406 and any accompanying rotor assembly during operation of the compressor 402. In one embodiment, the bearings 408 may be magnetic bearings, such as active or passive magnetic bearings. In at least one embodiment, and for the purposes of this disclosure, the bearings 408 may be substantially similar to the magnetic bearing 100 discussed above with reference to FIG. 1.

The system 400 may further include a cooling loop 412 configured to circulate a cooling gas through the compressor 402, and particularly through the bearing cavities 410 in order to regulate the temperature of the bearings 408. The cooling loop 412 may include a blower device 414 configured to pressurize the cooling gas in the cooling loop 412. In one embodiment, the cooling loop 412 and the blower device 414 are substantially similar to the cooling loop(s) and blower device(s) described in co-owned U.S. patent application Ser. No. 13/233,436,059 entitled "Method and System for Cooling a Motor-Compressor with a Closed-Loop Cooling Circuit," filed on Sep. 15, 2011, the contents of which are herein incorporated by reference to the extent not inconsistent with the present disclosure.

The cooling loop 412 may further include a gas conditioning skid 416 adapted to filter the cooling gas and reduce its temperature before injecting the cooling gas into the bearing cavities 410 arranged within the compressor 402. The gas conditioning skid 416 may include a heat exchanger (not shown) or any device adapted to reduce the temperature of a fluid. For example, the heat exchanger may include, but is not limited to, a direct contact heat exchanger, a trim cooler, a mechanical refrigeration unit, and/or any combination thereof. In one embodiment, the gas conditioning skid 416 may also include a density-based separator (not shown), or the like, configured to remove any condensation generated by reducing the temperature of the cooling gas. Accumulated liquids or contaminants within the gas conditioning skid 416 may be discharged via line 418.

Notwithstanding the collection and removal of liquids from the cooling gas via the gas conditioning skid 416, liquids or other contaminants may nonetheless accumulate throughout the cooling loop 412, thereby threatening the integrity of the radial bearings 408. Accordingly, the system 400 may further include one or more dummy bearings 420 that can be monitored to detect liquid within the system 400 and thereby indirectly monitor an equivalent resistance to ground of the radial bearings 408 arranged about the shaft 406. Since the dummy bearing 420 is arranged within the same cooling loop 412 as the radial bearings 408, the environmental conditions affecting the dummy bearing 420 (e.g., the presence of liquids or other contaminants) are indicative of the environmental conditions affecting the radial bearings 408. Consequently, monitoring the resistance to ground of the dummy bearing 420 may be indicative of the resistance to ground of the radial bearings 408. Thus, once the resistance to ground of the coils 422a, 422b of the dummy bearing 420 reaches a predetermined level, appropriate preventative measures may be undertaken with the radial bearings 408 to avoid damage or eventual failure.

The dummy bearing(s) 420 may be substantially similar in construction to the radial bearings 408 (or the radial magnetic bearing 100 as described above). For example, the dummy bearing 420 may include one or more magnetic "poles" or bearing coils, such as coils 422a and 422b, formed by multiple revolutions of electrical windings 426 about corresponding protrusions 427a and 427b. The coils 422a,b may be coupled to a bearing stator 424, or at least a section of a bearing stator annulus, and may combine to form a dummy bearing magnetic pole pair, as defined above. In other words, the dummy bearing 420 may be made or otherwise manufactured with only two protrusions 427a,b, which save on manufacturing costs. It will be appreciated, however, that the dummy bearing 420 may equally function with only a single magnetic pole or coil (i.e., 422a or 422b).

The coils 422a,b, stator 424, and windings 426 may be substantially similar to the coils 110a-h, stator 102, and windings 108, respectively, described above with reference to FIG. 1, and therefore will not be described again in detail. Moreover, similar to the coils 110a-h described above, the coils 422a,b of FIG. 4 may have a VPI coating (or similar insulative or protective coating) applied thereto in order to prevent the general ingress of liquids or other contaminants to the coils 422a,b.

Much like the sensing wire 202 of FIG. 2, the windings 426 may act as a sensing wire for the dummy bearing 420 by monitoring the resistance to ground for each coil 422a,b as the VPI coating (or similar insulative coating) degrades over time. Also, similar to the sensing wire 202 of FIG. 2, the windings 426 may be communicably or otherwise electrically coupled to a sensing device 428 not unlike the sensing device 204 described above. Accordingly, the sensing device 428 may be configured to continuously or periodically monitor the resistance to ground of the windings 426 and thereby provide a current or real-time reading of the resistance to ground of each coil 422a,b.

In operation, the dummy bearing 420 is not used to support the shaft 406 like the radial bearings 408 are. Instead, the dummy bearing 420 serves as a representative bearing arranged within the same cooling loop 412 as the radial bearings 408, and therefore is affected by the same environmental conditions affecting the radial bearings 408. Accordingly, monitoring the resistance to ground of the coils 422a,b arranged within the dummy bearing 420 may be substantially if not equally indicative of the resistance to ground of the coils arranged within the radial bearings 408. Consequently, appropriate corrective action may be undertaken in the radial bearings 408 once the resistance to ground measured by the coils 422a,b of the dummy bearing 410 reaches a predetermined threat level.

In one or more embodiments, the dummy bearing(s) 420 may be arranged at one or more "low points" in the cooling loop 412, in other words, locations in the cooling loop 412 where liquids are more prone to accrue. For example, one or more dummy bearings 420 may be arranged within the casing 404 vertically below each radial bearing 408, such as at a first location 430 and a second location 432, as shown in FIG. 4. In another embodiment, the dummy bearing 420 may be disposed outside of the casing 404 and arranged within the cooling loop 412 after the gas conditioning skid 428, such as at a third location 434. In at least one embodiment, the third location 434 is also located physically below the vertical height of the radial bearings 408, thereby being arranged at another "low point" in the cooling loop 412. It will be appreciated, however, that dummy bearings 420 may be placed in various locations inside and outside of the casing 404, without departing from the scope of the disclosure. For instance, it is also contemplated herein to arrange the dummy bearing 420 about the shaft 406, axially-adjacent at least one of the radial bearings 408.

Moreover, the coils 422a,b may be arranged within the dummy bearing 420 itself where liquids and contaminants are more prone to accumulate. For example, liquids will tend to amass in the bottom section of the dummy bearing 420, such as near the area where the stator 424 or bearing 420 are located below the dummy bearing 420 horizontal line B. Accordingly, the coils 422a,b may be generally located near the bottom of the dummy bearing 420 and therefore more susceptible to the ingress of liquids or other contaminants.

Figure 5:
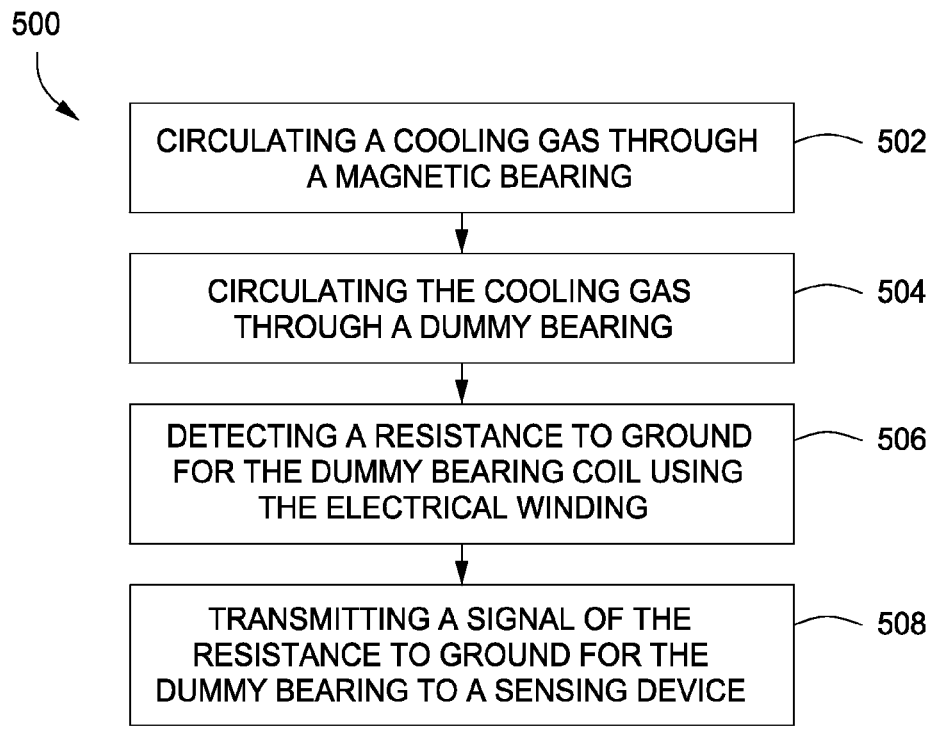
FIG. 5 depicts a schematic of another method of monitoring the resistance to ground of magnetic bearing coils, according to one or more embodiments disclosed.

Referring now to FIG. 5, illustrated is a schematic method 500 of monitoring the resistance to ground of a magnetic bearing. The method 500 may include circulating a cooling gas through the magnetic bearing, as at 502. The magnetic bearing may be arranged in a cooling loop and have a plurality of bearing coils. The magnetic bearing may also be disposed or otherwise arranged within a bearing cavity defined within a casing. In one embodiment, the magnetic bearing has an insulative coating disposed thereon to protect against the ingress of liquids. The cooling gas may also be circulated through a dummy bearing arranged in the cooling loop, as at 504. The dummy bearing may have at least one dummy bearing coil made of, at least in part, an electrical winding, wherein the electrical winding has insulative coating disposed thereon for protection. In at least one embodiment, the insulative coating disposed on the electrical windings is the same type of material disposed on the bearing coils of the magnetic bearing.

The method 500 may also include sensing a resistance to ground for the dummy bearing coil using the electrical winding, as at 506. Once sensed, a signal of the resistance to ground for the dummy bearing coil may be transmitted to a sensing device communicably coupled to the electrical winding, as at 508. In one embodiment, the signal of the resistance to ground for the dummy bearing coil is indicative of a signal of the resistance to ground for the radial bearing coils. Accordingly, monitoring or otherwise detecting the resistance to ground of the dummy bearing coils with the sensing device, may provide insight as to the internal condition and resistance to ground of the radial bearing coils.

In the preceding description of the representative embodiments of the disclosure, the directional terms "bottom" and "below" are used for convenience in referring to the accompanying Figures. In general, "below" refers to a direction away from the horizontal with respect to the stator of the magnetic bearing, regardless of the radial or circumferential disposition of the magnetic bearing. Moreover, the term "bottom" is not to be limiting of the actual device or system or use of the device or system.

The foregoing has outlined features of several embodiments so that those skilled in the art may better understand the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

We claim:

1. A magnetic bearing, comprising:
    a stator having a plurality of protrusions extending radially-inward therefrom and electrical windings wound about each protrusion to form a corresponding plurality of bearing coils, the plurality of bearing coils being disposed within an insulative coating adapted to protect against the ingress of liquids;
    a controller communicable with the electrical windings and configured to control an electrical current in each bearing coil to maintain a rotor centered within the stator;
    a sensing wire coupled to at least one of the plurality of bearing coils and also disposed within the insulative coating; and
    a sensing device communicably coupled to the sensing wire and configured monitor a resistance to ground of the sensing wire, wherein the resistance to ground of the sensing wire is indicative of a resistance to ground of the at least one the plurality of bearing coils.

2. The magnetic bearing of claim 1, wherein the electrical windings are individually insulated and made of an electrically-conductive material.

3. The magnetic bearing of claim 1, wherein the sensing wire is insulated and made of an electrically-conductive material.

4. The magnetic bearing of claim 3, wherein the sensing wire is wrapped around the at least one of the plurality of bearing coils by one or more revolutions.

5. The magnetic bearing of claim 1, wherein the insulative coating is an epoxy resin applied to the plurality bearing coils using vacuum pressure impregnation.

6. The magnetic bearing of claim 1, wherein the sensing device provides an output indicating a real-time resistance to ground of the at least one of the plurality of bearing coils.

7. The magnetic bearing of claim 1, wherein the sensing wire comprises several sensing wires coupled to each bearing coil individually.

8. The magnetic bearing of claim 1, wherein the stator is circular and the plurality of bearing coils are equidistantly-spaced about the stator.

9. The magnetic bearing of claim 1, wherein the at least one of the plurality of bearing coils is disposed at the bottom of the stator.

10. A method of operating a magnetic bearing, comprising:
    circulating a cooling gas through a bearing cavity where the magnetic bearing is arranged, the magnetic bearing having a circular stator with a plurality of coils extending radially-inward therefrom, the plurality coils having an insulative coating disposed thereon to protect against the ingress of liquids;
    sensing a first resistance to ground with a sensing wire coupled to the first coil, the sensing wire also having the insulative coating disposed thereon; and
    monitoring the first resistance to ground as the insulative coating degrades over time, the first resistance to ground being monitored with a sensing device communicably coupled to the sensing wire, and wherein the first resistance to ground is indicative of a resistance to ground of the first coil.

11. The method of claim 10, further comprising disposing the first coil at the bottom of the stator.

12. The method of claim 10, wherein the sensing wire is further coupled to a second coil disposed circumferentially-adjacent the first coil, the first and second coils forming a first magnetic pole pair.

13. The method of claim 12, further comprising:

sensing a second resistance to ground using the sensing wire; and monitoring the second resistance to ground as the insulative coating degrades over time, the second resistance to ground being indicative of a resistance to ground of the first magnetic pole pair.

14. The method of claim 13, further comprising providing an output from the sensing device indicating the real-time second resistance to ground for the first magnetic pole pair.

15. A magnetic bearing, comprising:

a circular stator having a plurality of magnetic pole pairs spaced about the stator and extending radially-inward therefrom, each magnetic pole pair comprising a pair of adjacent bearing coils protected against the ingress of liquids by an insulative coating;

a sensing wire coupled to a first magnetic pole pair, the first magnetic pole pair being arranged at the bottom of the stator, wherein the sensing wire is also disposed within the insulative coating; and a sensing device communicably coupled to the sensing wire and configured to monitor a resistance to ground of the sensing wire as the insulative coating degrades over time, wherein the resistance to ground of the sensing wire is indicative of a resistance to ground of the first magnetic pole pair.

16. The magnetic bearing of claim 15, wherein the insulative coating is an epoxy resin applied to the bearing coils using vacuum pressure impregnation.

17. The magnetic bearing of claim 15, wherein each magnetic pole pair is equidistantly-spaced about a circumference of the stator.

18. The magnetic bearing of claim 15, wherein the sensing wire is made of an electrically-conductive material that is insulated on its outside.

19. The magnetic bearing of claim 18, wherein the first magnetic pole pair comprises a first bearing coil and a bearing second coil, the sensing wire being wrapped around the first and second bearing coils individually by at least two revolutions.

20. The magnetic bearing of claim 15, wherein the sensing device provides an output indicating the real-time resistance to ground of the first magnetic pole pair.

* * * * *